United States Patent [19]

Kawasaki et al.

[11] Patent Number: 4,863,554

[45] Date of Patent: Sep. 5, 1989

[54] PROCESS FOR PULLING A SINGLE CRYSTAL

[75] Inventors: Akihisa Kawasaki; Toshihiro Kotani; Ryusuke Nakai, all of Osaka; Shintaro Miyazawa; Keigo Hoshikawa, both of Isehara, all of Japan

[73] Assignees: Sumitomo Electric Industries, Ltd.; Nippon Telegraph & Telephone Public Corporation, both of Japan

[21] Appl. No.: 17,072

[22] Filed: Feb. 20, 1987

Related U.S. Application Data

[62] Division of Ser. No. 643,033, Aug. 21, 1984, abandoned.

[30] Foreign Application Priority Data

Aug. 23, 1983 [JP] Japan ............................... 58-154264

[51] Int. Cl.⁴ .............................................. C30B 15/14
[52] U.S. Cl. ................................. 156/617.1; 422/249; 156/619.1; 156/620.5; 156/620.3

[58] Field of Search ......... 156/617 SP, 617 V, 617 R, 156/619; 422/249

[56] References Cited

U.S. PATENT DOCUMENTS 4,038,201 7/1977 Hargreaves .................. 156/616.41

FOREIGN PATENT DOCUMENTS

| 0141495 | 5/1983 | European Pat. Off. ............ 422/249 |
| 1435250 | 7/1966 | France . |
| 57-11897 | 1/1982 | Japan . |
| 58-135626 | 8/1983 | Japan . |

*Primary Examiner*—Kenneth M. Schor
*Assistant Examiner*—L. Johnson
*Attorney, Agent, or Firm*—Wenderoth, Lind & Ponack

[57] ABSTRACT

An apparatus for pulling a single crystal by CZ method or LEC method is improved. To this end, the heater for heating the inside of the furnace is divided at least in the vicinity of the solid-liquid interface into at least two heaters. Using this apparatus, a single crystal with a decreased dislocation density can be obtained.

1 Claim, 1 Drawing Sheet

PROCESS FOR PULLING A SINGLE CRYSTAL

This application is a divisional of application Ser. No. 643,003, filed Aug. 21, 1984, now abandoned in favor of continuing application Ser. No. 19,201, filed Feb. 26, 1987.

BACKGROUND OF THE INVENTION

1. Field of the Invention

This invention relates to an apparatus for pulling a single crystal by the Czochralski method (hereinafter referred to as the CZ method) or by the Liquid Encapsulated Czochralski method (hereinafter referred to as the LEC method).

2. Description of Prior Art

In an apparatus for pulling a single crystal by the CZ method or the LEC method as shown in FIG. 1, raw material melt 4 (e.g. GaAs) is charged into crucible 3, the surface of which is optionally covered with $B_2O_3$ melt 5 (in the case of the LEC method), and seed crystal 6 fitted to pull rod 8 is immersed in the surface of melt 4, wetted and then pulled up to obtain single crystal 7 (e.g. GaAs). 1 designates a heater in a furnace, 2 designates a susceptor (carbon) and 9 is a crucible support shaft (lower shaft).

In this apparatus, one heater has been used so as to maintain a predetermined temperature distribution in the furnace according to the prior art, but this fails to result in the production of a high quality single crystal for of the following reasons: The temperature distribution on the central axis (vertical direction) of single crystal 7 varies with the time when seeding, when single crystal 7 comes out of $B_2O_3$ melt and when most of single crystal 7 is pulled up, and for example, the dislocation density (EPD) is thus increased from the seed end to the tail end to a greater extent. As single crystal 7 is pulled out of the $B_2O_3$ melt 5, for example, single crystal 7 is cooled by a high pressure gas and the temperature gradient in the axial direction of single crystal 7 is increased which causes thermal stress and increases dislocation density. A large temperature gradient in the $B_2O_3$ melt 5 is also a cause thereof.

When using one heater, it is impossible to controllably heat the single crystal 7 and the raw material melt 4 independently and to hold constant the temperature distribution in the vicinity of the solid-liquid interface from the start to the end of crystal growth. Accordingly, the single crystal cannot be given a low dislocation density from the seed end to the tail end thereof by the use of one heater as in the prior apparatus.

SUMMARY OF THE INVENTION

It is an object of the present invention to provide an apparatus for the growth of single crystals, whereby the above described disadvantages of the prior art apparatus can be overcome.

It is another object of the present invention to provide an apparatus for the Czochralski growth of compound single crystals in which the temperature distribution in the vertical direction can readily be controlled from seeding to pulling-up of a single crystal.

It is a further object of the present invention to provide an apparatus for pulling a single crystal with a low dislocation density.

These objects can be attained by an apparatus for pulling a single crystal by the CZ method, characterized in that a heater in the furnace is divided at least in the vicinity of the solid-liquid interface into two or more heaters.

BRIEF DESCRIPTION OF THE DRAWINGS

The accompanying drawings illustrate the principle and merits of the present invention in more detail.

DETAILED DESCRIPTION OF THE INVENTION

The inventors have made various efforts to develop an apparatus for the Czochralski growth of a single crystal with a lowered dislocation density from the seed end to the tail end of the single crystal and consequently have found that such a single crystal can be obtained by the use of a single crystal pulling apparatus provided with two or more heaters (two or more heating zones) divided at least in the vicinity of the solid-liquid interface, whereby the temperature distribution in the vertical direction can readily be controlled. The present invention is based on this finding.

Accordingly, the present invention provides an apparatus for pulling a single crystal by the CZ method, characterized in that a heater in a furnace consists of two or more heaters or heating zones divided in the vicinity of the solid-liquid interface. The divided two or more heaters serve to control the temperature gradient in the vertical direction near the solid-liquid interface so as to be 5°–100° C./cm, preferably 5° to 60° C./cm and more preferably 5° to 30° C./cm.

Single crystals pulled by the apparatus of the present invention include compounds of Group III–V elements of the Periodic Table (e.g. GaAs, InAs, GaP, InP, etc.), compounds of Group II–VI elements (e.g. ZnSe, etc.) or mixed crystals thereof, elementary semiconductors such as Si and Ge, oxides, nitrides, carbides and the like. In particular, the apparatus of the present invention can be applied with good success to the LEC method in which control of temperature gradient in the vertical direction is difficult because of pulling a single crystal at a high pressure, e.g. 10 to 60 atm using $B_2O_3$ melt.

Figure 1:
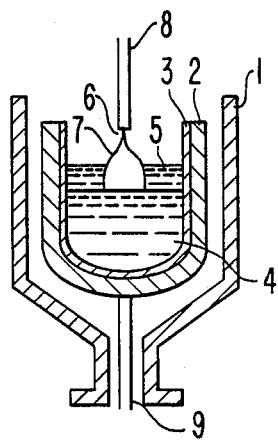
FIG. 1 is a vertical-sectional view of one example of an apparatus for pulling a single crystal according to the prior art.
Figure 2:
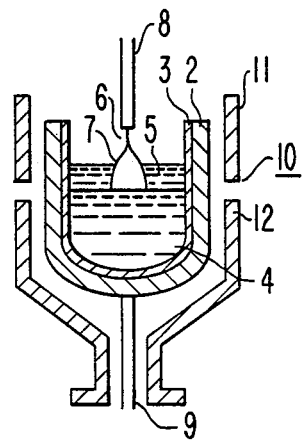
FIG. 2 is a vertical-sectional view of one embodiment of an apparatus for pulling a single crystal according to the present invention.

The present invention will now be illustrated as to one preferred embodiment referring to the accompanying drawing. FIG. 2 is a vertical sectional view of one example of the apparatus of the present invention, in which the same numerals show the same parts as those of FIG. 1. The difference between FIG. 1 and FIG. 2 is that heater 1 in a furnace of FIG. 1 is divided in the vicinity of the interface 13 between the raw material melt 4 and the $B_2O_3$ melt 5 (solid-liquid interface) into 2-stage heater 10 consisting of upper heater 11 and lower heater 12. Upper heater 11 is used for the purpose of mainly controlling the temperature in the vicinity of the solid-liquid interface and the pulled single crystal, and lower heater 12 is used for the purpose of mainly controlling the temperature of the raw material melt. These heaters are controlled individually or in combination, whereby the temperature in the vertical direction can readily be controlled to give a predetermined temperature distribution from the seeding of a single crystal to the end of pulling the same.

One preferred embodiment of pulling a single crystal by means of the apparatus of the present invention will be given below:

Firstly, the power ratio (calorific power) of heaters 11 and 12 is changed to provide conditions capable of giving a small temperature gradient (e.g. 5° to 100° C./cm) in the central portion of $B_2O_3$ melt 5 in the vertical direction. Under these conditions, seeding is started and when single crystal 7 comes out of $B_2O_3$ melt 5 and is exposed to a high pressure gas, single crystal 7 is warmed by upper heater 11 while observing the growth of the diameter of single crystal 7, and pulling of the single crystal is continued while keeping the temperature gradient in the vertical direction near the solid-liquid interface, for example, at 5° to 100° C./cm.

When the power supplied to the upper heater 11 is increased and single crystal 7 becomes smaller, the power supplied to the lower heater 12 is somewhat reduced and pulling is continued to maintain the diameter of single crystal 7. The power ratio as described above depends largely on the heater structure, but, for example, is in the range of an upper to lower ratio of 1-2 to obtain a temperature gradient of 5°-60° C./cm.

Since heater 10 for heating the inside of the furnace is divided into two stages 11 and 12 which can be controlled individually or in combination as described above, control of the temperature distribution during growth of a single crystal can readily be carried out to hold constant the diameter of the single crystal being grown.

The heater for heating the inside of a furnace in the present invention is not limited to one having two stages or zones as shown in FIG. 2, but other heaters of three or more stages or zones can of course be used if at least one divided part is provided in the vicinity of the solid-liquid interface.

The apparatus for pulling a single crystal according to the present invention, as illustrated above, has the following advantages:

Since the heater for heating the inside of a furnace is constructed of heaters having two or more stages, divided at least in the vicinity of the crystal growth interface, it is possible to control these heaters individually, to change freely the temperature gradient in the vertical direction near the solid-liquid interface of a single crystal, to reduce the temperature gradient, in particular, when the single crystal comes out of the $B_2O_3$ melt, and to keep the temperature gradient small and constant from the start to the end of pulling the single crystal. Therefore, the use of the apparatus of the present invention results in production of a high quality single crystal with a low dislocation density and a uniformity of dislocation densities from the seed end to the tail end of the single crystal and a high yield.

For example, a LED fabricated on a wafer with a large dislocation density has a short life, because in a semi-insulating single crystal of GaAs (undoped or Cr-doped) this is a strong relationship between the dislocation density and resistance and the yield of the device is greatly affected by the dislocation density, so the apparatus of the present invention has important significances, in particular, in these uses.

The following example is given in order to illustrate the present invention without limiting the same.

EXAMPLE

GaAs single crystal was pulled using the apparatus of the present invention as shown in FIG. 2.

About 5 kg of GaAs polycrystal raw material and 500 g of $B_2O_3$ were charged into a quartz crucible of 150 mm in diameter, melted and pulled in a <001> direction at a pressure of 10 kg/cm$^2$ in a furnace, a pulling rate of 12 mm/hr, a crucible raising rate of 1 mm/hr, a pull rod 8 and crucible support rod 9 revolving rate of 10 rpm and a temperature gradient of about 20° C./cm, the temperature gradient being in the vertical direction near the solid-liquid interface during seeding, thus obtaining GaAs single crystal of 50 mm in diameter and about 500 mm in length. During the growing, the temperature gradient was held at 20° C./cm.

For comparison, a single crystal was similarly prepared but using a pulling apparatus of the prior art, provided with only one heater. In this case, the temperature gradient was above 100° C./cm.

Figure 3:
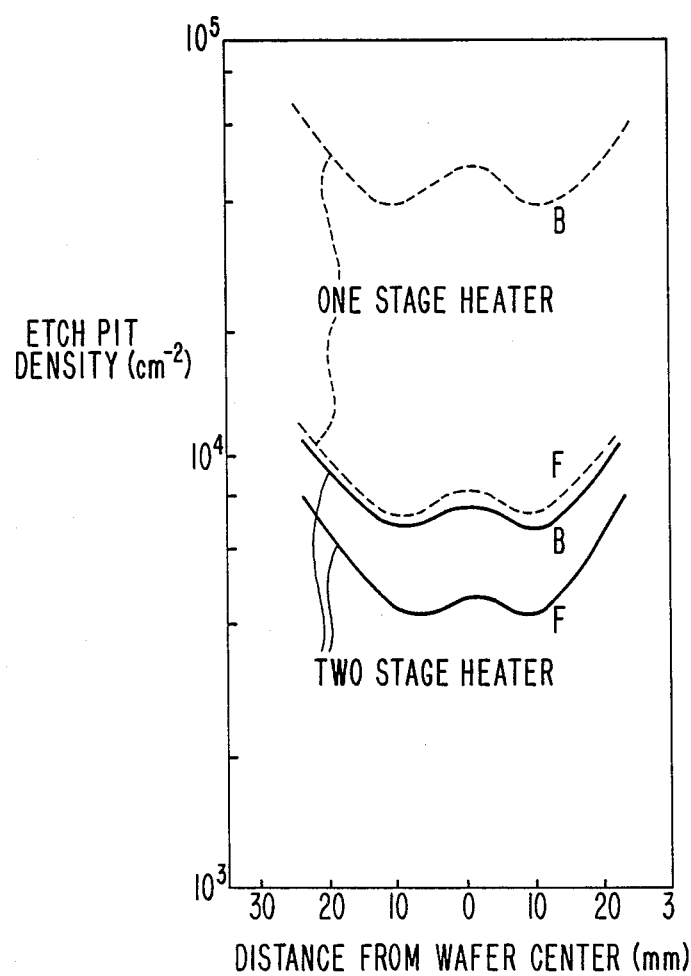
FIG. 3 is a graph showing the etch pit density distributions on the seed ends and the tail ends of single crystals prepared according to the present invention and the prior art.

(001) wafers cut from the seed end (F) and the tail end (B) of the single crystals were subjected to etching with molten KOH and to measurement of the etch pit density (EPD), thus obtaining results as shown in FIG. 3, in which solid lines show EPD when using the two-stage heater and dotted lines show EPD when using the one-stage heater, ordinate: EPD (cm$^{-2}$) and abscissa: distance (mm) from centre of wafer. EPD was measured at points in <011> direction on (001) wafers. The mean EPD was as shown in Table 1:

TABLE 1

|  | Mean EPD ($\times$ 10$^4$ cm$^{-2}$) | |
| --- | --- | --- |
|  | Seed End (F) | Tail End (B) |
| Present Invention | 0.6 | 0.9 |
| Prior Art | 0.9 | 5 |

As is evident from the results of FIG. 3 and Table 1, EPD is lower and hardly changes from the seed end to the tail end in the present invention, while EPD is greatly increased from the seed end to the tail end in the prior art.

What is claimed is:

1. A process for preparing a single crystal which comprises pulling a solid single crystal by the Czochralski method or by the Liquid Encapsulated Czochralski method from a liquid raw material melt in a crucible said solid single crystal and said liquid raw material forming a solid-liquid interface, and simultaneously keeping a temperature gradient of 5° to 100° C./cm at least in the vicinity of the solid-liquid interface by heating the lower part of the interior of the crucible extending upward to the level of the solid-liquid interface by a first heater and heating the upper part of the crucible from the solid-liquid interface upwardly therefrom by a second heater, the upper part of the lower heater being adjacent the lower part of the upper heater in the vicinity of the solid-liquid interface and operating said first and second heaters to maintain said temperature gradient.

* * * * *